United States Patent
Beilker

(10) Patent No.: US 9,448,677 B2
(45) Date of Patent: Sep. 20, 2016

(54) OPERATING DEVICE

(71) Applicant: Dirk Beilker, Frankfurt (DE)

(72) Inventor: Dirk Beilker, Frankfurt (DE)

(73) Assignee: Continental Automotive GmbH, Hannover (DE)

( * ) Notice: Subject to any disclaimer, the term of this patent is extended or adjusted under 35 U.S.C. 154(b) by 59 days.

(21) Appl. No.: 14/367,771

(22) PCT Filed: Dec. 19, 2012

(86) PCT No.: PCT/EP2012/076110
§ 371 (c)(1),
(2) Date: Jun. 20, 2014

(87) PCT Pub. No.: WO2013/092683
PCT Pub. Date: Jun. 27, 2013

(65) Prior Publication Data
US 2014/0368465 A1 Dec. 18, 2014

(30) Foreign Application Priority Data

Dec. 22, 2011 (DE) .................. 10 2011 089 693

(51) Int. Cl.
*G06F 3/041* (2006.01)
*G06F 3/044* (2006.01)
*H03K 17/975* (2006.01)
(Continued)

(52) U.S. Cl.
CPC ............ *G06F 3/044* (2013.01); *G06F 3/0414* (2013.01); *H03K 17/975* (2013.01); *H05K 1/16* (2013.01); *H03K 2217/96062* (2013.01); *H05K 1/0278* (2013.01); *H05K 2201/09063* (2013.01);

(Continued)

(58) Field of Classification Search
CPC combination set(s) only.
See application file for complete search history.

(56) References Cited

U.S. PATENT DOCUMENTS 4,325,102 A 4/1982 English
4,359,720 A * 11/1982 Chai ..................... H03K 17/98
341/26

(Continued)

FOREIGN PATENT DOCUMENTS

CN 101524001 9/2009
DE 3433921 3/1986

(Continued)

OTHER PUBLICATIONS

Wikipedia. "Kapazitiver Sensor", retrieved from http://de.wikipedia.org/wiki/Kapazitive_Sensor, retrieved 2014, (2 pages).

(Continued)

*Primary Examiner* — Gerald Johnson
*Assistant Examiner* — Robert Michaud
(74) *Attorney, Agent, or Firm* — Cozen O'Connor

(57) ABSTRACT

An operating device has an input element with haptic feedback and with a rigid printed circuit board. The printed circuit board has a stationary first printed circuit board region and a second printed circuit board region adjacent to the first printed circuit board region and deflectable relative to the second circuit board region. The first printed circuit board region has a first electrode of a capacitor and the second printed circuit board region has a second electrode of the capacitor, and the input element is operatively connected to the second printed circuit board region such that an actuation of the input element deflects the second printed circuit board region relative to the first printed circuit board region so as to vary the distance of the first electrode from the second electrode.

11 Claims, 4 Drawing Sheets

(51) Int. Cl.
*H05K 1/16* (2006.01)
*H05K 1/02* (2006.01)

(52) U.S. Cl.
CPC ............... *H05K2201/10053* (2013.01); *H05K 2201/10196* (2013.01)

(56) References Cited

U.S. PATENT DOCUMENTS

| | | | |
|---|---|---|---|
| 2004/0080922 A1* | 4/2004 | Aoyagi | H01F 17/0013 361/793 |
| 2008/0204409 A1* | 8/2008 | Wright | G06F 3/0202 345/157 |
| 2011/0075384 A1 | 3/2011 | Yeates | |
| 2011/0140935 A1* | 6/2011 | Anorozo | H03K 17/962 341/33 |
| 2013/0021087 A1* | 1/2013 | Rosset | G05G 9/047 327/509 |

FOREIGN PATENT DOCUMENTS

| | | |
|---|---|---|
| DE | 10 2010 007486 | 8/2011 |
| EP | 0 064 240 A2 | 11/1982 |
| EP | 2 337 225 A1 | 6/2011 |
| JP | 55-30192 | 3/1980 |
| WO | WO 2008/046188 A1 | 4/2008 |
| WO | WO 2008/103943 A1 | 8/2008 |
| WO | WO 2011/071837 | 6/2011 |
| WO | WO 2011/094882 | 8/2011 |

OTHER PUBLICATIONS

Sesterhenn, M. "Mikromechanische Füllstandssensoren", Dipl-Phys., Stuggart 2001, pp. 81-182.

\* cited by examiner

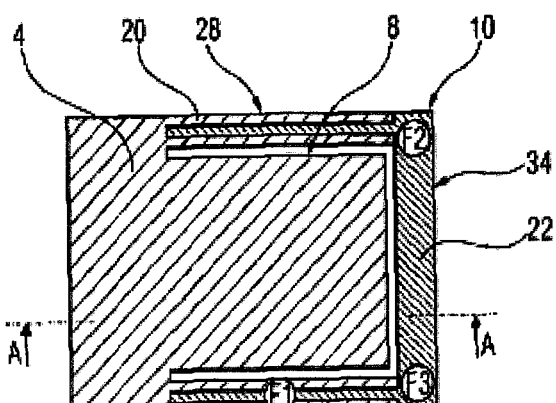
FIG. 5
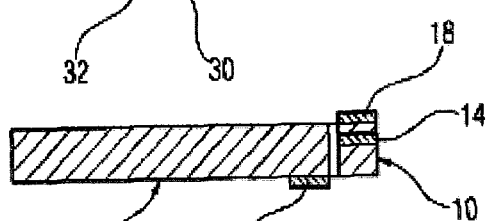
FIG. 6A
FIG. 6B
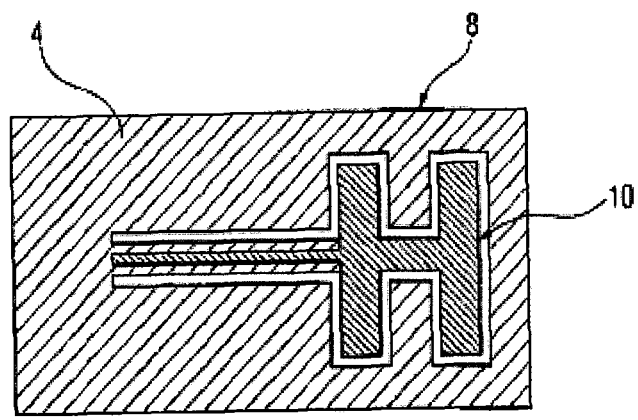
FIG. 7

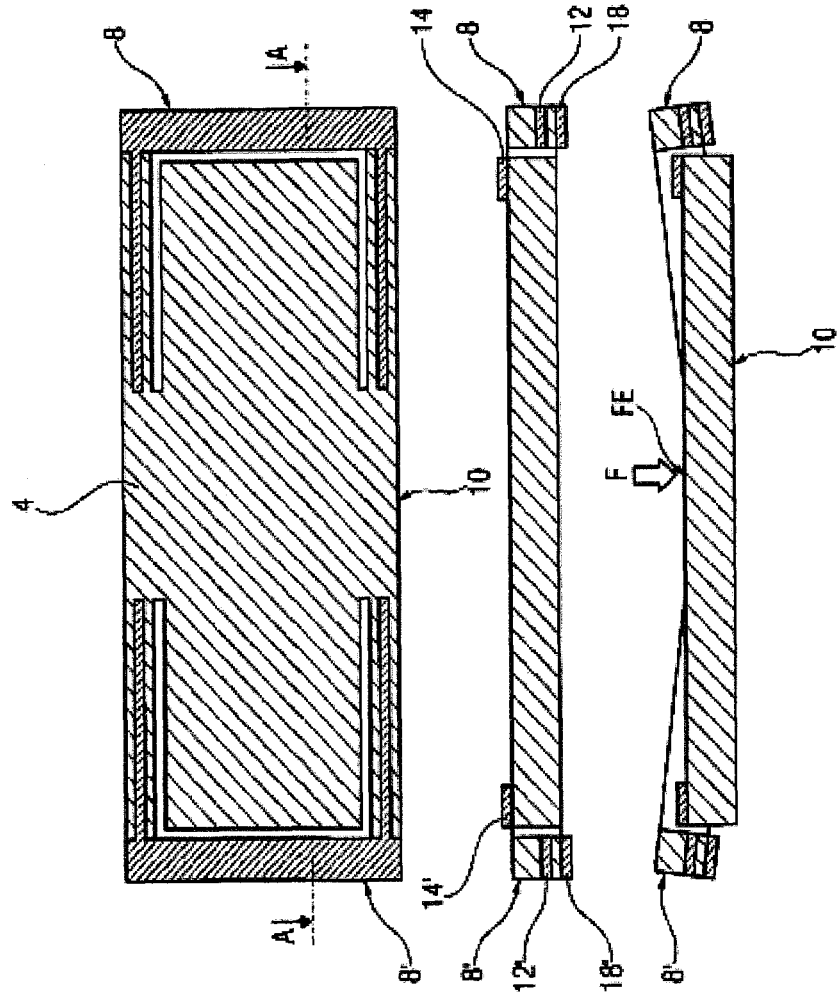

OPERATING DEVICE

CROSS-REFERENCE TO RELATED APPLICATIONS

This is a U.S. national stage of application No. PCT/EP2012/076110, filed on 19 Dec. 2012, which claims priority to the German Application No. 10 2011 089 693.7, filed 22 Dec. 2011, the content of both incorporated herein by reference.

BACKGROUND OF THE INVENTION

1. Field of the Invention

The invention relates to an operating device with an input element with haptic feedback and with a rigid printed circuit board.

2. Related Art

Such an operating device is known, for example, as an operating device with haptic feedback of the input element for a motor vehicle. Due to the haptic feedback, that is to say feedback based on the sense of touch, it is possible for a user, in particular a driver of the motor vehicle, to operate the operating device by hand, without having to devote his undivided attention during the entire process of operating the operating device. This is because, with the haptic feedback, the user, for example, can be certain of having actually made an input into the operating device without having to see the operating device to confirm this. So as to ensure both the haptic feedback and the recognition of an input, a complex sensor arrangement is necessary in the known operating device.

SUMMARY OF THE INVENTION

An object of the invention is to create an operating device that ensures reliable operation with simple structure.

This object is achieved in accordance with the invention in that the printed circuit board has a stationary first printed circuit board region and a second printed circuit board region adjacent to the first printed circuit board region and deflectable relative to the first printed circuit board region, wherein the first printed circuit board region comprises a first electrode of a capacitor and the second printed circuit board region comprises a second electrode of the capacitor, and in that the input element is operatively connected to the second printed circuit board region such that an actuation of the input element deflects the second printed circuit board region relative to the first printed circuit board region so as to vary the distance of the first electrode from the second electrode.

The operating device according to an aspect of the invention consequently provides a capacitor, which serves indirectly for the uptake of a force applied to the input element upon actuation of the input element and which serves directly for the uptake of the displacement, resulting from this force, in the form of the deflection of the second printed circuit board region and therefore the change in distance between the first electrode and the second electrode. The capacitance of the capacitor changes with the change in distance between the first and second electrode. This change in capacitance of the capacitor can be evaluated, for example, by an evaluation unit of the operating device. The result of the evaluation can be used, for example, as a switching signal for an electrical appliance, for example, an air-conditioning system or a radio, in a motor vehicle. The capacitor is thus part of a capacitive sensor of the operating device, wherein the capacitive sensor is provided for force uptake and displacement uptake in the operating device. Depending on the conditions and individual requirements, a network of capacitors may also be provided. The capacitor electrodes are preferably copper electrodes and can be provided both on the printed circuit board and, for example, in the form of a multi-ply printed circuit board (or multi-layer printed circuit board), within the printed circuit board. It is also conceivable to provide such a multi-ply printed circuit board structure for the capacitor electrodes only in the first printed circuit board region or in the second printed circuit board region.

The input element is operatively connected to the second printed circuit board region, that is to say a force acting on the input element is transmitted to the second printed circuit board region. In the simplest case, the input element and printed circuit board region may bear against one another in the force direction, such that a compressive force can be transmitted from the input element to the second printed circuit board region. In principle, the connection between the input element and second printed circuit board region is arbitrary, provided the deflection according to the invention of the second printed circuit board region can be performed. By way of example, it is also conceivable for the input element and the second printed circuit board region to be fixedly coupled to one another resiliently, such that transverse forces and tensile forces on the input element also cause a deflection of the second printed circuit board region. The input element can preferably be actuated perpendicularly to its surface, and the input element is operatively connected to the second printed circuit board region in such a way that, as a result of the actuation of the input element, the second printed circuit board region is deflected in a direction perpendicular to the printed circuit board plane of the rigid printed circuit board. However, other arrangements are also conceivable in principle, for example, an actuation of the input element in a direction parallel to the printed circuit board plane and a corresponding deflection of the second printed circuit board region laterally and in a direction parallel to the printed circuit board plane.

With the invention, a distance between the first and second electrode and also the capacitance of the capacitor resulting from the distance are of significance. The aforementioned distance changes with an actuation of the input element. Whether the aforementioned distance increases or reduces with an actuation of the input element is of significance merely for the evaluation of this distance change in the evaluation unit. In principle, both a reduction and an increase of the capacitance of the capacitor can be evaluated and identified by the evaluation unit as an input, that is to say actuation of the input element.

With the operating device according to the invention, it is particularly advantageous that the device can be produced with just a few component parts. Additional component elements, such as spring contacts, insulation elements, guide elements and shielding plates, can be omitted advantageously with the invention. The production outlay for the operating device is thus reduced, and the durability is improved. The operating device according to the invention can be produced easily and cost-effectively and has high reliability and operational dependability. The operating device according to the invention is therefore suitable in particular as an operating device for a motor vehicle.

With the invention, a rigid printed circuit board, which is used in the operating device to receive and contact a wide range of electric component parts, is particularly advantageously used additionally for force uptake and displacement uptake in conjunction with an actuation of the input element. The second printed circuit board region is rigid per se, but can be deflected resiliently in particular with respect to the first printed circuit board region. A printed circuit board that is rigid on the whole, yet has a resilient property in a certain region, specifically the second printed circuit board region, is thus provided. Minimal displacements, in particular displacements with a length from 0.05 mm to 0.4 mm, of the input element or minimal forces, in particular forces from 1 to 4 N, on the input element for operation advantageously can be identified and utilized in the operating device according to the invention. Individual electrodes can be contacted to ground in order to shield against interfering influences.

In accordance with an advantageous development of the invention, the first printed circuit board region or the second printed circuit board region has a further electrode corresponding to the first electrode or to the second electrode respectively and forming a capacitor. The further electrode and the first or second electrode respectively may thus form an unchangeable basic capacitance, whereas the first and the second electrode together form a parasitic capacitance. The functional reliability of the operating device can be increased further in this way. An increased basic capacitance of the capacitor can be achieved with the aforementioned development. In addition, the further electrode may advantageously develop a shielding effect where necessary.

An actuation of the input element of the operating device according to the invention can be facilitated advantageously if, in accordance with another development of the invention, the second printed circuit board region comprises a finger-shaped connection portion, which is directly connected to the stationary first printed circuit board region, and an electrode portion carrying at least the second electrode and arranged on an end of the second printed circuit board region remote from the connection portion. The resilience of the second printed circuit board region can thus be increased and the deflectability thereof simplified. The connection portion of the second printed circuit board region is connected at a connection point to the first printed circuit board region.

In accordance with another advantageous development of the invention, the second printed circuit board region is U-shaped, wherein the legs of the U, each forming a finger-shaped connection portion, are directly connected to the first printed circuit board region, and wherein the foot region of the U connecting the legs, thus forming the electrode portion, carries at least the second electrode. A particularly high stability of the operating device with simultaneously good deflectability of the second printed circuit board region can thus be attained.

Both the capacitance of the capacitor and the size of the capacitance change upon actuation of the input element can be increased if, in accordance with another advantageous development of the invention, at least the first electrode and the second electrode are each formed in a comb-shaped manner. Here, the first electrode and the second electrode preferably each form a comb structure, the comb structures meshing with one another in the capacitor.

In accordance with another advantageous development of the invention, the second printed circuit board region is connected at a connection point to the first printed circuit board region, and the first printed circuit board region and the second printed circuit board region are at least separated from one another only by a narrow gap at least at the electrode portion of the second printed circuit board region comprising the second electrode. An increased capacitance of the capacitor can thus be achieved. The gap is preferably exactly wide enough so that a deflection of the second printed circuit board region relative to the first printed circuit board region is not impeded, that is to say there is no contact between the two printed circuit board regions in the event of a deflection of the second printed circuit board region. The gap may advantageously be a milled-out portion in the printed circuit board.

An actuation of the input element can be facilitated advantageously if, in accordance with another development of the invention, the input element is operatively connected at a force introduction point to the second printed circuit board region, wherein the force introduction point is arranged on an end of the second printed circuit board region remote from a connection point at which the second printed circuit board region is connected to the first printed circuit board region. The input element may bear against the second printed circuit board region, for example, at the force introduction point, such that a compressive force can be transmitted to the second printed circuit board region. The large distance between the force introduction point and connection point result in a comparatively high resilience of the second printed circuit board region at the force introduction point and therefore a large deflection of the second printed circuit board region with comparatively low actuation force on the input element.

In accordance with another advantageous development of the invention, the input element is operatively connected to the second printed circuit board region at least at two force introduction points, wherein the force introduction points are distributed over the second printed circuit board region. Due to the provided plurality of force introduction points, it is possible, upon actuation of the input element, to obtain a mean value for the deflection of the second printed circuit board region.

A particularly high sensitivity of the operating device in terms of an actuation of the input element can also be achieved if, in accordance with another advantageous development of the invention, two stationary first printed circuit board regions are provided, wherein the two first printed circuit board regions are arranged on opposite sides of the printed circuit board. The two first printed circuit board regions are preferably each U-shaped. The opposite sides of the printed circuit board are sides of the printed circuit board facing away from one another.

In accordance with an advantageous development, for particularly easy actuation, the input element is operatively connected to the second printed circuit board region at a force introduction point, wherein the force introduction point is arranged between the two first printed circuit board regions. The force introduction point is preferably arranged centrally between the first printed circuit board regions.

It would be conceivable to arrange an evaluation unit for evaluation of the change in capacitance of the capacitor in a housing of the operating device, for example. However, it is particularly advantageous for a contact structure of the operating device if, in accordance with another development of the invention, the electrodes are connected by conductive tracks of the printed circuit board to an evaluation unit arranged on or in the printed circuit board. In addition, possible interfering influences on the operating device can thus also be minimized. The evaluation unit preferably comprises an integrated circuit.

In accordance with another advantageous development of the invention, the input element has a display arrangement. For comprehensive, variable operability of a wide range of appliances and/or arrangements, in particular in a motor vehicle, the operating device may thus have a touch-sensitive screen. The display arrangement may preferably have an electro-optical display, for example, a liquid crystal display.

BRIEF DESCRIPTION OF THE DRAWINGS

Exemplary embodiments of the invention are shown in the drawings in sketched schematic illustration and will be described hereinafter in greater detail. In the drawings:

FIG. 5 shows a plan view of another printed circuit board of an operating device;

FIGS. 6A, 6B show sectional side views of the printed circuit board according to FIG. 5;

FIG. 7 shows a plan view of a further printed circuit board of an operating device;

FIG. 8 shows a plan view of a further printed circuit board of an operating device; and FIGS. 9A, 9B show sectional side views of the printed circuit board according to FIG. 8.

DETAILED DESCRIPTION OF THE PRESENTLY PREFERRED EMBODIMENTS

Corresponding elements are provided in all Figures with like reference signs.

Figure 1:
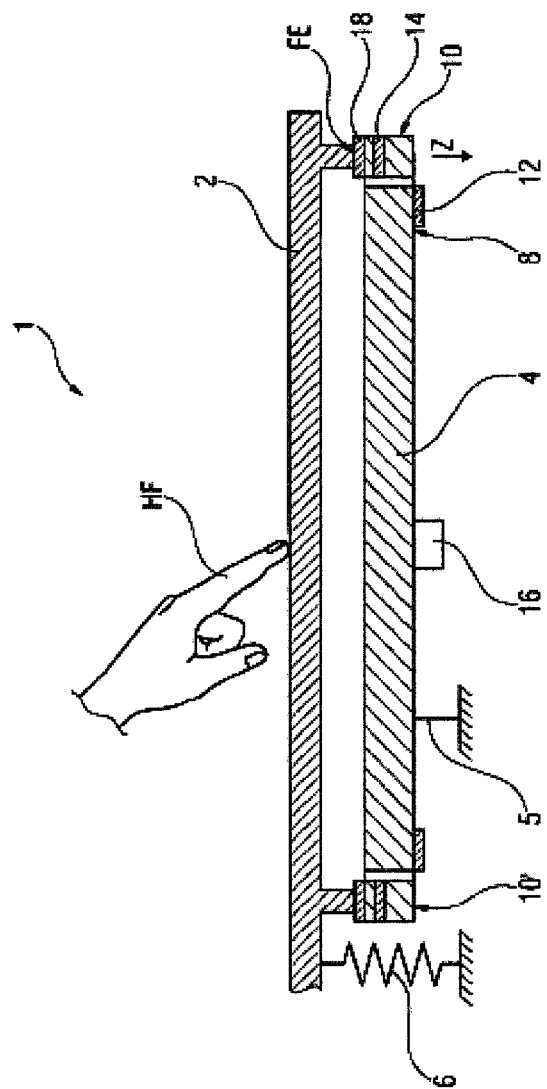
FIG. 1 shows a sectional side view of a detail of an operating device with a printed circuit board.

FIG. 1 shows an operating device 1 with an input element 2 with haptic feedback and with a rigid printed circuit board 4. The position of the printed circuit board 4 on the whole is fixed (symbolized by a support 5) with respect to a surrounding environment, for example, a housing, of the operating device 1. The position of a spring element 6, which spring element 6 holds the input element 2 in a fixed position without external application of force, is also fixed with respect to the environment surrounding the operating device 1.

The printed circuit board 4 comprises a stationary first printed circuit board region 8 and a second printed circuit board region adjacent to the first printed circuit board region 8 and deflectable relative to the first printed circuit board region 8. The input element 2 is operatively connected at a force introduction point FE to the second printed circuit board region 10. By pressing on the input element 2, for example, by a finger HF of a hand of a user, the second printed circuit board region is deflected relative to the first printed circuit board region 8 in the direction of an arrow Z pointing downwardly in the view according to FIG. 1.

The first printed circuit board region 8 comprises a first electrode 12 of a capacitor, and the second printed circuit board region 10 comprises a second electrode 14 of the capacitor. It can be seen that the input element 2 is operatively connected to the second printed circuit board region 10 such that an actuation of the input element 2, here by pressing on the input element 2 by the finger HF, deflects the second printed circuit board region 10 relative to the first printed circuit board region 8 so as to vary the distance of the first electrode 12 from the second electrode 14.

The capacitance of the capacitor changes due to the change in distance of the electrodes 12, 14 from one another. This capacitance change, which is evaluated by an evaluation unit 16 arranged on the printed circuit board 4, is a measure for the deflection of the second printed circuit board region 10 and therefore for the actuation of the input element 2.

The second printed circuit board region 10 comprises a further electrode 18 corresponding to the second electrode 14 and forming a capacitance with this electrode 14. The second electrode 14 and the further electrode 18 form an unchangeable basic capacitance of the capacitor, whereas the second electrode 14 and the first electrode 12 form a variable parasitic capacitance of the capacitor, this capacitance being dependent on the deflection of the second printed circuit board region 10.

It can be seen that the operating device according to FIG. 1 is symmetrical and, besides an above-described first second printed circuit board region 10, has an identical further second printed circuit board region 10', which is opposite the first second printed circuit board region 10 and is arranged adjacently to the first printed circuit board region 8.

Figure 2:
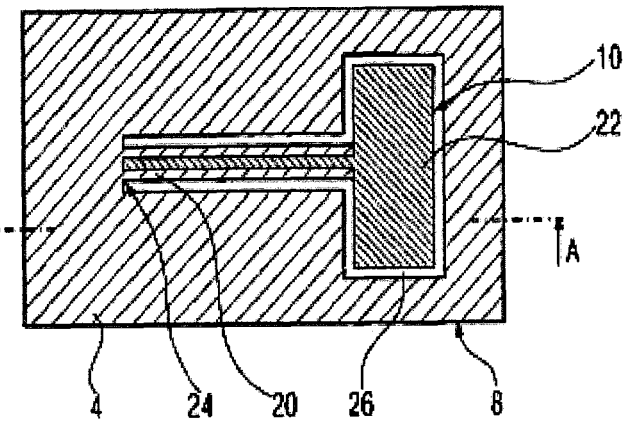
FIG. 2 shows a plan view of a printed circuit board of an operating device.

FIG. 2 shows a plan view of a rigid printed circuit board 4 with a stationary first printed circuit board region 8 and a second printed circuit board region 10 of an operating device, the second printed circuit board region 10 being deflectable relative to the first printed circuit board region 8. The second printed circuit board region 10 comprises a finger-shaped connection portion 20, which is directly connected to the stationary first printed circuit board region 8, and an electrode portion 22. The electrode portion 22 is arranged on an end of the second printed circuit board region 10 remote from the connection portion 20.

The connection portion 20 of the second printed circuit board region 10 is connected at a connection point 24 to the first printed circuit board region 8. The first printed circuit board region 8 and the second printed circuit board region 10 are separated from one another only by a narrow gap 26 both at the connection portion 20 of the second printed circuit board region 10 and at the electrode portion 22 of the second printed circuit board region 10.

Figure 3A:
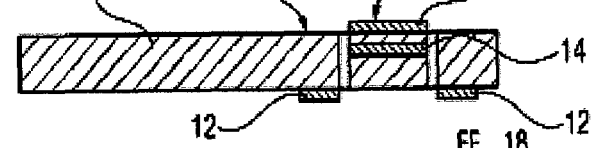
FIGS. 3A, 3B show sectional side views of the printed circuit board according to FIG. 2.

A first variant of the printed circuit board 4 according to FIG. 2 is shown in a section A-A (see FIG. 2) in FIG. 3A. The first printed circuit board region 8 comprises a first electrode 12, and the second printed circuit board region 10 comprises a second electrode 14. The second printed circuit board region 10 comprises a further electrode 18, which forms a basic capacitance with the second electrode 14. The second printed circuit board region 10 is structured in the form of a multi-ply printed circuit board (or multi-layer printed circuit board).

Figure 3B:
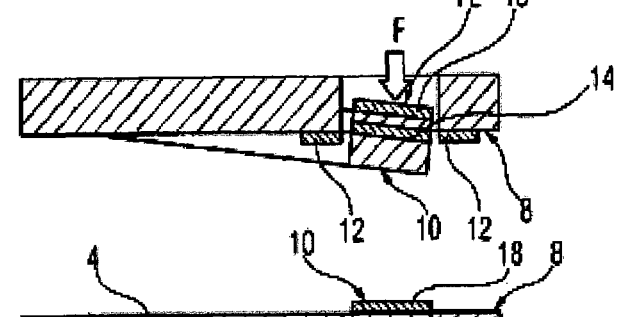

FIG. 3B shows the illustration according to FIG. 3A with application of a force F, which force is the result of an actuation of an input element (not illustrated here), to the second printed circuit board region 10, such that this printed circuit board region 10 is deflected relative to the first printed circuit board region 8. The total capacitance of a capacitor comprising the first electrode 12, the second electrode and the further electrode 18 changes as a result of the deflection. The total capacitance of the capacitor increases as a result of the deflection.

The force F acts at a force introduction point FE, at which the input element is operatively connected to the second printed circuit board region 10. The force introduction point FE is arranged on an end of the second printed circuit board region 10 remote from the connection portion 20, here on the electrode portion 22.

The force F deflects the second printed circuit board region 10, which, due to its design, has a resilient, flexible property with respect to the first printed circuit board region 8, and thus changes the course of the electric field and the capacitance of the capacitor.

Figure 4A:
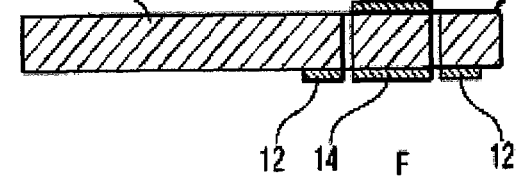
FIGS. 4A, 4B show sectional side views of a variant of the printed circuit board according to FIG. 2.

A second variant of the printed circuit board 4 according to FIG. 2 is shown in FIG. 4A in a section A-A (see FIG. 2). The arrangement of the first electrode 12 in the first printed circuit board region 8 corresponds to that according to FIGS. 3A and 3B. The second printed circuit board region 10 is structured here as a two-layer printed circuit board with the second electrode 14 and the further electrode 18. The first electrode 12 and the second electrode 14 are arranged in one plane in the non-deflected position of the second printed circuit board region 10.

Figure 4B:
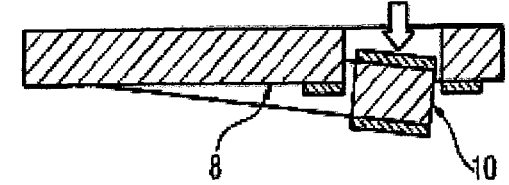

Under the effect of a force F (FIG. 4B), the second printed circuit board region 10 is deflected relative to the first printed circuit board region 8. The total capacitance of the capacitor comprising the first electrode 12, the second electrode 14 and the further electrode reduces.

Here, the force F also deflects the second printed circuit board region 10, which, due to its design, has a resilient, flexible property with respect to the first printed circuit board region 8, and thus changes the course of the electric field and the capacitance of the capacitor.

FIG. 5 shows a further rigid printed circuit board 4 with a first stationary printed circuit board region 8, and a second printed circuit board region 10, which is deflectable relative to the first printed circuit board region 8. The second printed circuit board region 10 is U-shaped, wherein the legs 28, 30 of the U are each connected directly to the first printed circuit board region 8, thus forming a finger-shaped connection portion 20, 32 respectively. The foot region 34 of the U connecting the legs 28, 30 forms an electrode portion 22 of the second printed circuit board region 10.

Three force introduction points F1, F2, F3 are provided on the second printed circuit board region 10 and are distributed over the second printed circuit board region 10. A first force introduction point F1 is located on a leg 30, and the two further force introduction points F2, F3 are located on the foot region 34.

The influence of a parasitic capacitor capacitance is increased by the end-face broad foot region 34 and accordingly formed electrodes 12, 14, 18, whereby the sensitivity of a displacement uptake in the event of a deflection of the second printed circuit board region 10 relative to the first printed circuit board region 8 increases.

FIGS. 6A, 6B show the printed circuit board 4 according to FIG. 5 in a section A-A (see FIG. 5). The first printed circuit board region 8 comprises a first electrode 12, and the second printed circuit board region 10 comprises a second electrode 14 and a further electrode 18. The second electrode 14 and the further electrode 18 form a basic capacitance of a capacitor, and the first electrode 12 and the second electrode 14 form a parasitic capacitance of the capacitor. In the event of deflection of the second printed circuit board region 10 as a result of the effect of a force F (FIG. 6B), the parasitic capacitance of the capacitor and therefore also the total capacitance of the capacitor change, the total capacitance being formed from basic capacitance and parasitic capacitance.

A plan view of a further exemplary embodiment of a rigid printed circuit board 4 for an operating device is shown in FIG. 7. The printed circuit board 4 has a first, stationary printed circuit board region 8 with a first electrode, and a second printed circuit board region 10 with a second electrode, which second printed circuit board region 10 is deflectable relative to the first printed circuit board region 8. The printed circuit board 4 according to FIG. 7 is similar to the printed circuit board according to FIG. 2, however, in the case of the printed circuit board according to FIG. 7, the first printed circuit board region 8 and the second printed circuit board region 10 and therefore also the first electrode and the second electrode mesh with one another in a comb-like manner. The first electrode and second electrode are each formed in a comb-shaped manner. The capacitor capacitance can be increased due to the comb-shaped configuration.

A further exemplary embodiment of a rigid printed circuit board 4 of an operating device is shown in FIG. 8. In the case of this printed circuit board 4, two stationary first printed circuit board regions 8, 8' are provided, wherein the two first printed circuit board regions 8, 8' are arranged on opposite sides of the printed circuit board 4 and are each U-shaped. The two first printed circuit board regions 8, 8' each have, respectively, a first electrode 12, 12' and a further electrode 18, 18' of a capacitor (see FIG. 9A).

The first printed circuit board regions 8, 8' correspond to and surround a second printed circuit board region 10, which second printed circuit board region 10 is deflectable relative to the first printed circuit board regions 8, 8' with actuation of an input element (not illustrated here) and resultant effect of a force F (see FIG. 9B). To this end, the input element is operatively connected at a force introduction point FE to the second printed circuit board region 10, wherein the force introduction point FE is arranged between the two first printed circuit board regions 8, 8', in this case centrally therebetween. The second printed circuit board region 10 comprises second electrodes 14, 14' of the capacitors. The capacitance of the capacitors changes with the deflection of the second printed circuit board region 10, whereby an actuation of the input element is identified in the operating device by means of an evaluation unit.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it, should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An operating device, comprising:
an input element with haptic feedback; and
a rigid printed circuit board having:
   a stationary first printed circuit board region, and
   a second printed circuit board region adjacent to the first printed circuit board region and deflectable relative to the first printed circuit board region,
wherein the first printed circuit board region comprises a first electrode of a capacitor and the second printed circuit board region comprises a second electrode of the capacitor, and the input element is operatively connected to the second printed circuit board region such that an actuation of the input element deflects the second printed circuit board region relative to the first printed circuit board region so as to vary the distance of the first electrode from the second electrode, and wherein the second printed circuit board region comprises a finger-shaped connection portion, directly connected to the stationary first printed circuit board region, and an electrode portion carrying at least the second electrode and arranged on an end of the second printed circuit board region remote from the finger-shaped connection portion, the finger-shaped connection portion comprising an extending cantilevered portion configured to permit deflection of the second printed circuit board region relative to the first printed circuit board region to vary the distance of the first electrode from the second electrode.

2. The operating device as claimed in claim 1, wherein the first printed circuit board region or the second printed circuit board region has a further electrode corresponding to the first electrode or to the second electrode respectively and forming a capacitance.

3. The operating device as claimed in claim 1, wherein the second printed circuit board region is U-shaped, wherein the legs of the U each form a finger-shaped connection portion directly connected to the first printed circuit board region, and wherein the foot region of the U connects the legs, thus forming the electrode portion, and carries at least the second electrode.

4. The operating device as claimed in claim 1, wherein at least the first electrode and the second electrode are each formed in a comb-shaped manner.

5. The operating device as claimed in claim 1, wherein the second printed circuit board region is connected at a connection point to the first printed circuit board region, and the first printed circuit board region and the second printed circuit board region are at least separated from one another only by a narrow gap at least at the electrode portion of the second printed circuit board region comprising the second electrode.

6. The operating device as claimed in claim 1, wherein the input element is operatively connected at a force introduction point to the second printed circuit board region, wherein the force introduction point is arranged on an end of the second printed circuit board region remote from a connection point at which the second printed circuit board region is connected to the first printed circuit board region.

7. The operating device as claimed in claim 1, wherein the input element is operatively connected to the second printed circuit board region at least at two force introduction points, wherein the force introduction points are distributed over the second printed circuit board region.

8. The operating device as claimed in claim 1, wherein two stationary first printed circuit board regions are provided, wherein the two first printed circuit board regions are arranged on opposite sides of the printed circuit board.

9. The operating device as claimed in claim 8, wherein the input element is operatively connected to the second printed circuit board region at a force introduction point, wherein the force introduction point is arranged between the two first printed circuit board regions.

10. The operating device as claimed in claim 1, wherein electrodes are connected by conductive tracks of the printed circuit board to an evaluation unit arranged on or in the printed circuit board.

11. The operating device as claimed in claim 1, wherein the input element has a display arrangement.

* * * * *